US009656290B1

(12) United States Patent
Ehrenberg et al.

(10) Patent No.: US 9,656,290 B1
(45) Date of Patent: May 23, 2017

(54) STENCIL MASKS FOR MAKING CONFORMABLE ELECTROMAGNETIC DEVICE STRUCTURES

(71) Applicants: The United States of America, as represented by the Secretary of the Air Force, Washington, DC (US); Massachusetts Institute of Technology, Cambridge, MA (US)

(72) Inventors: Isaac M. Ehrenberg, Brookline, MA (US); Bae-Ian Wu, Beavercreek, OH (US); Sanjay Emani Sarma, Lexington, MA (US)

(73) Assignees: MASSACHUSETTS INSTITUTE OF TECHNOLOGY, Cambridge, MA (US); THE UNITED STATES OF AMERICA, AS REPRESENTED BY THE SECRETARY OF THE AIR FORCE, Washington, DC (US)

(*) Notice: Subject to any disclaimer, the term of this patent is extended or adjusted under 35 U.S.C. 154(b) by 81 days.

(21) Appl. No.: 14/325,351

(22) Filed: Jul. 7, 2014

Related U.S. Application Data

(60) Provisional application No. 61/843,127, filed on Jul. 5, 2013.

(51) Int. Cl.
*B05C 17/06* (2006.01)
*B05C 21/00* (2006.01)

(52) U.S. Cl.
CPC .................. *B05C 21/005* (2013.01)

(58) Field of Classification Search
None
See application file for complete search history.

(56) References Cited

U.S. PATENT DOCUMENTS

| 3,724,420 A | 4/1973 | Quinn | |
|---|---|---|---|
| 2008/0028956 A1* | 2/2008 | Sedberry | H01Q 1/42 101/129 |
| 2008/0047444 A1* | 2/2008 | Fields | A01G 1/00 101/127 |
| 2010/0258014 A1 | 10/2010 | van Heijningen | |

(Continued)

OTHER PUBLICATIONS

Gyuman Kim et al., Photoplastic shadow-masks for rapid resistless multi-layer micropatterning, TRANSDUCERS '01, The 11th International Conference on Solid-State Sensors and Actuators, Munich, Germany, Jun. 10-14, 2001.

*Primary Examiner* — Charles Capozzi
(74) *Attorney, Agent, or Firm* — Nutter McClennen & Fish LLP

(57) ABSTRACT

A new 3D stencil mask guides deposition of a shaped structure, typically an electromagnetic device component, onto a non-planar surface. The 3D stencil mask includes islands and bridges from prior art two-dimensional lettering stencils, but raises the islands and stencils above the side of the 3D stencil mask facing a non-planar surface, forming undercuts, so that material particles, such as from vacuum metal deposition, will form connected shapes. The 3D stencil mask is also configures so that the dimensions of the resulting electromagnetic structures are altered from a simple projected image of a structure designed for a planar surface so that the electromagnetic properties of the deposited structure are more nearly the same as those of a corresponding structure on a planar surface.

17 Claims, 7 Drawing Sheets

(56) References Cited

U.S. PATENT DOCUMENTS

2010/0260938 A1* 10/2010 Kondo ................. C23C 14/042
427/282
2011/0226143 A1* 9/2011 Cudworth ............... B05C 17/06
101/127

* cited by examiner

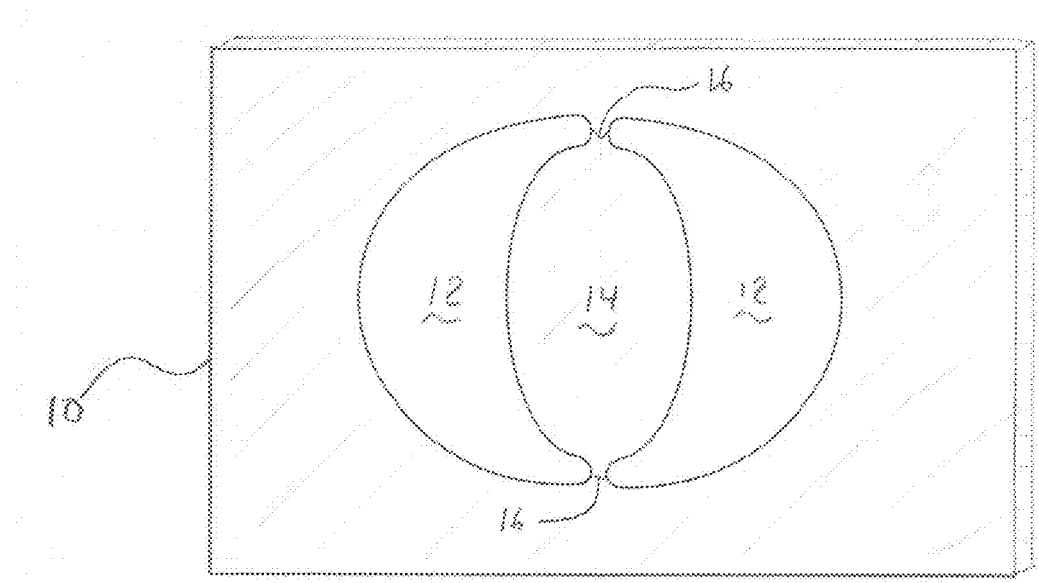
Prior Art  *FIG. 1*
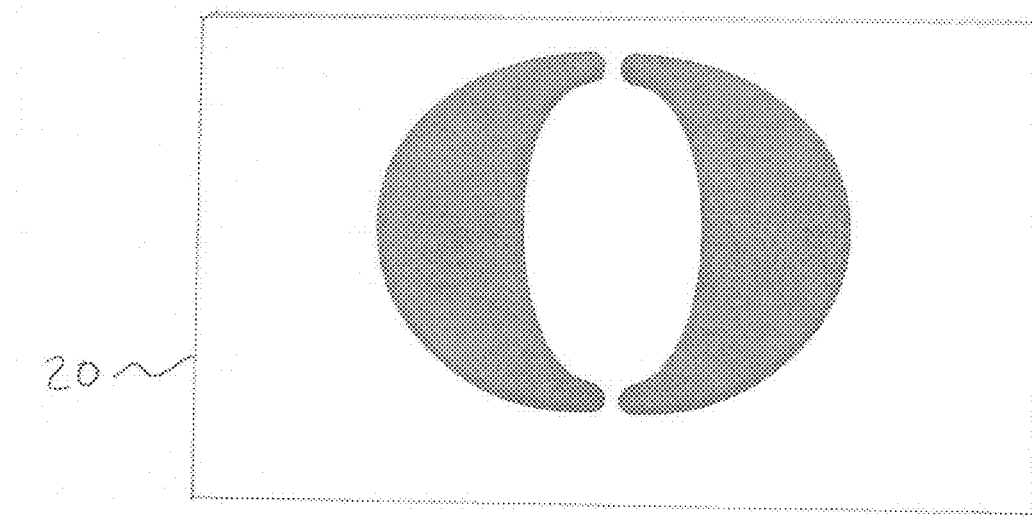
Prior Art  *FIG. 2*

STENCIL MASKS FOR MAKING CONFORMABLE ELECTROMAGNETIC DEVICE STRUCTURES

CROSS REFERENCE TO RELATED PATENT APPLICATIONS

This application claims priority under 35 U.S.C. §119(e) from U.S. provisional application 61/843,127, filed Jul. 5, 2013, and titled "Method for Fabricating Conformable Electromagnetic Structures and Devices." The invention description contained in that provisional application is incorporated by reference into this description.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to electromagnetic devices that can be conformably applied to non-planar surfaces, and more specifically to masks and stencils for applying conforming electromagnetic device structures to non-planar surfaces by selective metallization methods such as vacuum deposition and electrochemical coating.

Prior art approaches for making, for example, conformal antenna arrays on non-planar, often double-curved, airborne surfaces include multiple layers and tiles of printed circuit board (PCB) elements; and, PCB elements on flexible substrates.

Both approaches require intricate and time-consuming assembly steps, and introduce unwanted artifacts from applying primarily flat components to curved surfaces.

Direct patterning of electromagnetic devices on cylindrical or single curved surfaces has been accomplished by directive deposition through shadow masks and flexible contact masks.

Fully conformable electromagnetic devices have been made using direct writing processes in which robotic styluses seamlessly deposit thin layers of metallic ink. This approach can make fine line widths for precisely selective metallization, but is limited by the serial nature of the process and the physical and electrical properties of conductive ink.

There is, therefore, a need for better methods for making conformable electromagnetic structures.

There is a further need for optimized parameters for such conformable electromagnetic structures.

SUMMARY OF THE INVENTION

The complexities and limitations of the prior are overcome by a new 3D stencil mask that allows simple stenciling of electromagnetic device structures onto non-planar surfaces.

The 3D stencil mask includes islands and bridges from prior art two-dimensional lettering stencils, but raises the islands and stencils above the side of the 3D stencil mask facing a non-planar surface, forming undercuts, so that material particles, such as from vacuum metal deposition, will form connected shapes. The 3D stencil mask is also configured so that the dimensions of the resulting electromagnetic structures are altered from a simple projected image of a structure designed for a planar surface so that the electromagnetic properties of the deposited structure are more nearly the same as those of a corresponding structure on a planar surface.

BRIEF DESCRIPTION OF THE DRAWINGS

The teachings of the present invention will be better understood from the following drawings illustrating various aspects and example embodiments of the invention and its teachings.

FIG. 1 shows a very simplified view of an example prior art stencil for the letter "0."

FIG. 2 shows the letter "0" as made using the stencil of FIG. 1.

DETAILED DESCRIPTION

Figure 6:
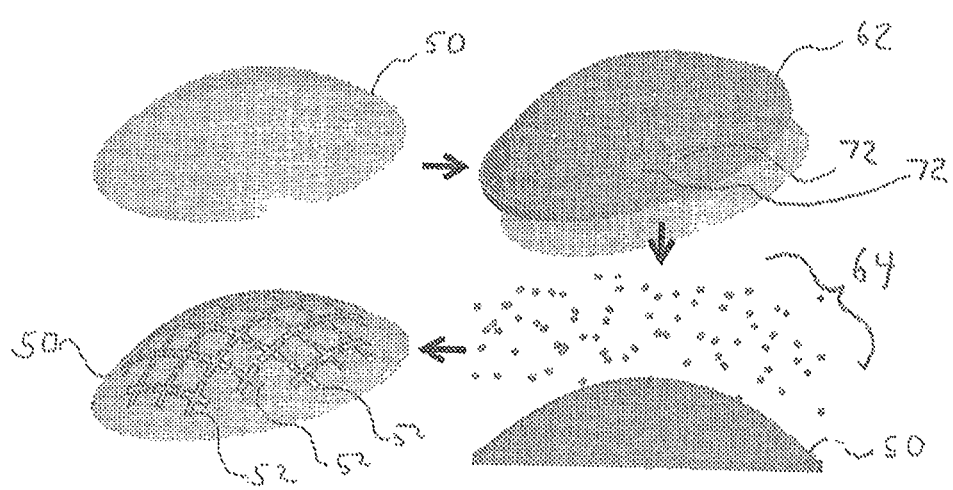
FIG. 6 shows an example embodiment of a 3D mask according to the teachings of the present invention used to direct or guide deposition of a pattern of stop or band pass filters onto a non-planar surface.
Figure 7:
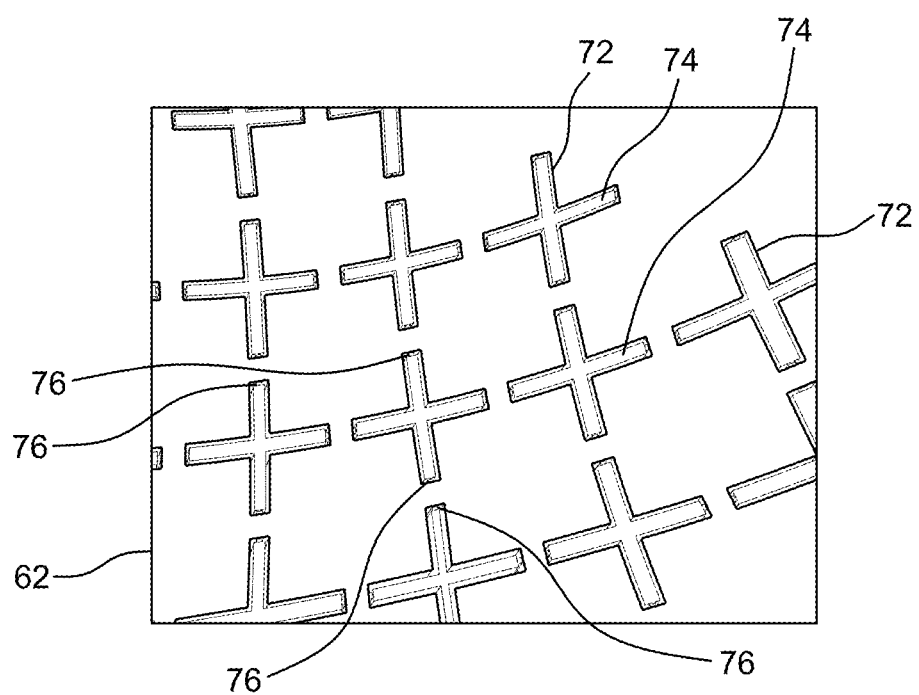
FIG. 7 shows a portion of the underside of the 3D mask of FIG. 6.
Figure 8:
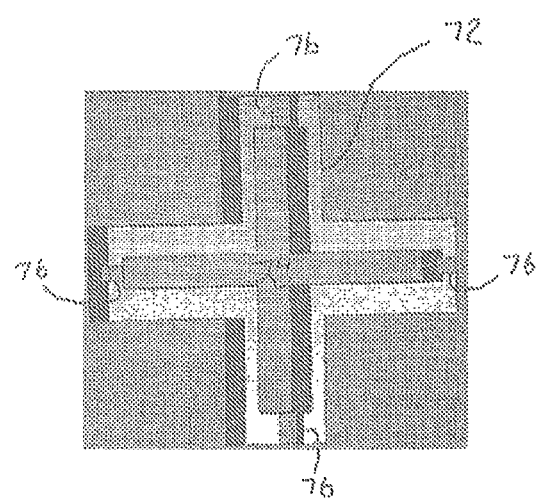
FIG. 8 shows an example mask element of the 3D mask of FIGS. 5, 6 and 7.

FIG. 1 shows a very simplified view of an example prior art stencil 10 for the letter "0." A prior art stencil will usually include many more characters, as shown, for example, in the example stencil print shown in the referenced provisional application. FIGS. 1-4 are highly simplified to more clearly illustrate some of the key teachings of the present invention which are otherwise often difficult to grasp when viewing only more practical example embodiments as shown in FIGS. 6-8.

A stencil character that includes a void, or voids, 12, such as an "0," is typically made by including an island 14 connected to the rest of stencil 10 by bridges 16. Otherwise, obviously, islands, such as island 14, would not remain connected to the rest of stencil 10.

Such islands and bridges result in the familiar disconnected lettering as shown in the letter "0" printed on a sheet of paper 20 shown in FIG. 2.

While such disconnected characters are not a problem for lettering, they are a problem for using stencils, or masks, to guide or direct deposition of electromagnetic materials onto surfaces where continuous metal layers are required for electromagnetic device structures to work.

Figure 3:
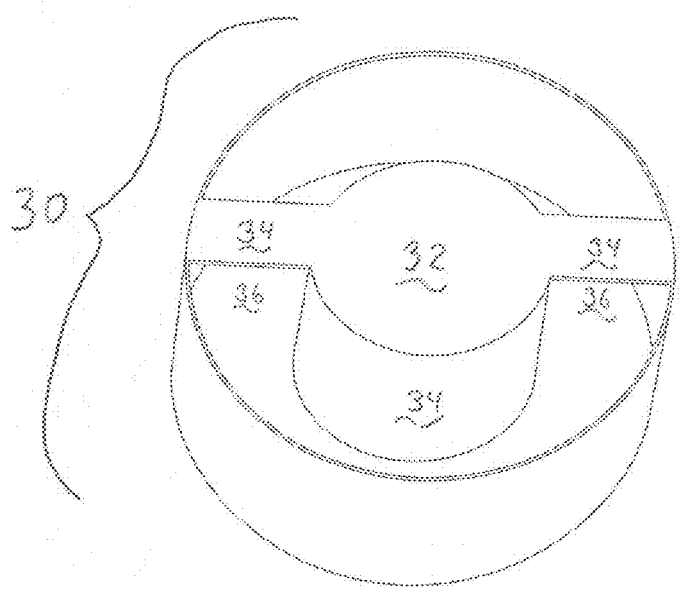
FIG. 3 shows a very simplified example embodiment of a 3D stencil according to the teachings of the present invention for making the letter "0".
Figure 4:
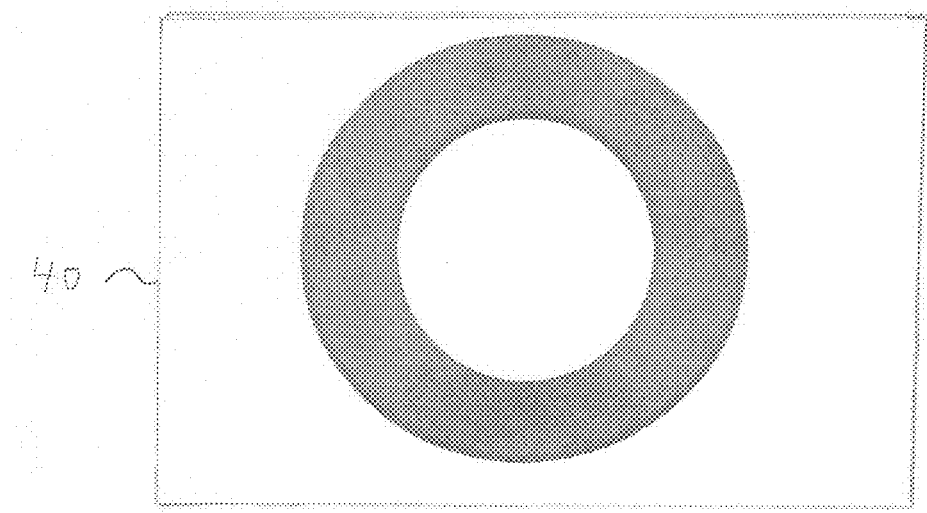
FIG. 4 shows the letter "0" made using the 3D stencil of FIG. 1.

FIG. 3 shows a very simplified example embodiment of a 3D stencil 30 according to the teachings of the present invention for making a continuous letter "0" as shown in FIG. 4.

FIG. 4 shows the letter "0" as made on a sheet of paper 40 using 3D stencil 30.

3D stencil 30 includes an island 32 and bridges 34, but only along the top, or opposing side, of 3D stencil 30. The outline, or shape, of island 32 extends through wall 34 to the bottom, or facing paper side, of 3D stencil 30, but without bridges. An undercut 36 is thus created below the conventional stencil outline at the top of 3D stencil 30 so that, when a spray of ink, or other, particles is passed through 3D stencil 30, a fully connected letter "O" is formed on sheet of paper 40.

Figure 5:
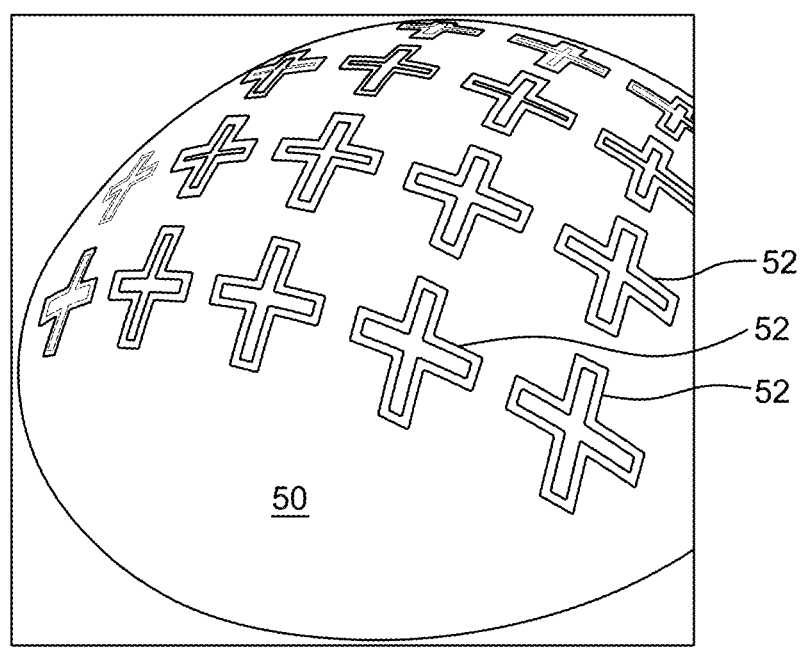
FIG. 5 shows an example pattern of stop or band pass filters on a non-planar curvilinear surface.

FIG. 5 shows a non-planar curvilinear surface 50, as might be the outer surface of an aircraft. A key object of the present invention is being able to deposit, in this example embodiment, a pattern of electromagnetic devices, such as stop or band pass filters 52 on non-planar curvilinear surface 50, typically as a metal layer.

FIG. 6 shows an example embodiment of a 3D mask 62, made according to the teachings of the present invention, used to guide or direct deposition of a pattern of stop or band pass filters 64 onto non-planar surface 50.

In the sequence of steps shown in FIG. 6, a 3D mask, or 3D stencil mask, 62 is placed over non-planar surface 50 and vacuum, or other conventional, deposition is used to deliver metal particles 64 through openings, or stencil elements, 72 in 3D mask 62 to deposit continuous stop or band pass filters 52 onto non-planar surface 50.

FIG. 7 shows a portion of the underside of 3D mask 62. As seen in FIG. 7, and as better understood from the teachings of the present invention as described in relation to FIGS. 3 and 4, each mask or stencil element 72 includes an island 74 connected to the rest of 3D mask 62 by bridges 76. Bridges 76 are connected to the rest of 3D mask 62 only above where the bottom of 3D mask 62 contacts non-planar surface 50, providing undercuts similar to as described in relation to FIG. 3.

FIG. 8 shows the underside of a single example mask or stencil element 72 of 3D mask 62, more clearly showing an island 74 and bridges 76 connecting island 74 only above the bottom of stencil element 72.

Island 74 is more clearly seen, and understood, by viewing it as facing toward the viewer's left.

Key to realizing conformal or conformed antenna arrays according to the teachings of the present invention is use of rapid prototyping, such as 3D printing, to produce not only a non-planar substrate, but also a 3D conformal mask to enable selective metallization of the substrate surface. Such 3D masks can be generated from the same equations that create an original non-planar substrate minus a projection of a finalized antenna array to enable selective metallization of the substrate surface.

While so-called "rapid" prototyping, such as 3D printing, is only "rapid" when compared to traditional machining, so that using 3D printing to deposit electromagnetic device structures directly onto non-planar surfaces would be very slow, stencil masks as described here, once made using rapid prototyping allows much faster fabrication of such electromagnetic device structures onto non-planar surfaces.

Metallization itself can be achieved using one of many available vacuum deposition and electrochemical methods. Vacuum deposition includes several low-pressure processes such as thermal evaporation, where solid metal pieces are vaporized by large currents running through tungsten electrodes, E-beam evaporation, where high energy electrons are used to melt and evaporate a desired material, and sputtering, where metal particles are knocked loose from a target by high energy ions. All three processes result in direct metallization as metal particles embed themselves within and form a film on top of any exposed surface on the substrate.

Several factors to consider when using vacuum metallization include deposition rate, which may only be microns per hour, maximum attainable film thickness due to delamination caused by residual stress, and thermal properties of the substrate and mask. Thermal properties of substrate materials are important given the energy dissipated as fast moving particles encounter the substrate and mask surface. Heat accumulation can be significant as both conductive and convective heat transfer is limited within a vacuum chamber. While elevated temperatures can induce melting and release stresses that cause mask or substrate deformation, such damage can be prevented by using plastics with higher deflection temperatures, or thicker masks and substrates to increase thermal mass.

Other important factors are substrate surface roughness and thin film material properties. Though the process of vacuum metallization can deposit pure metals, thin metal films on rough surfaces may yield higher resistances than films on smooth surfaces or bulk material. To the naked eye, a coating of one micron may appear complete and conformal, but resistance measurements indicate the conductivity of the coated surface is well below that of a solid metal sheet. Deposition of additional layers reduces sheet resistance, but can take some time to reach bulk conductivity levels. Increased film thickness increases likelihood of delamination, but surface roughness will mitigate the peeling factor.

Electrochemical coating methods such as electroplating or electroforming can also be used for metallization of substrates, although an adhesion promoting basecoat or surface chemistry treatment is often required. A 3D conformal mask according to the teachings of the present invention is used to ensure metallization is selective during an initial seeding step, which may involve conductive paint or a vacuum deposited pattern, followed by plating or electroforming. Despite additional process steps, electrochemical methods can rapidly produce relatively thick metal layers with improved structural and electrical properties compared to vacuum deposited films. Electrochemical coating processes that require an applied potential difference are ideally suited only for continuous topological structures, such as an array of patch antenna elements as described with regard to FIGS. 9(a)-(f), necessitating only a few conductive connections to facilitate coating of the entire geometry. Discontinuous designs, such as Frequency Selective Surface arrays, will require an electroless plating process in place of direct deposition.

While the desired result is fabrication of a conformal antenna array, the design process begins with a combination of the same analytical and numerical approaches commonly used to design and analyze canonical antenna elements and arrays. For such planar or simply curved elements, initial design criteria can be obtained through physics-based first principle models or more intricate formulations. These analytic or quasi-analytic methods yield preliminary radiation characteristics of the elements and overall array, which can then be extended and applied to the conformal antenna shape. As the complexity of the non-planar surface makes analytical tools more difficult to synthesize and less accurate, numerical analysis and full wave simulations are conducted to provide high accuracy results of conformal designs. Full wave simulation also represents an avenue towards optimization of antenna and array parameters to reach performance goals within geometric and fabrication constraints, some of which will be highlighted in the FIGS. 9(a)-(f) fabrication example. Graphical representations of complex surfaces lead directly to the design and fabrication of any required masking elements, which are then utilized for surface patterning with available coating methods, be they additive or the subtractive processes. By following this framework, sample material was measured to be 2.86 with a loss tangent bounded by 0.02.

FIGS. 9(a)-(f) shows a more advanced application of the teachings of the present invention so that the performance of a conformed electromagnetic device will more closely match the performance of a similar electromagnetic device on a plane surface.

A doubly curved surface 92 composed from a combination of Gaussian and sinusoidal functions was designed for implementing a conformal or conformed antenna array, where z(x, y) is defined by:

$$z(x, y) = A\sin\left(\frac{\pi}{l}x\right)\sin\left(\frac{\pi}{l}y\right)\sum_{n=0}^{4}\frac{1}{2}A_n e^{\frac{-(x-x_n)^2+(y-y_n)^2}{2\sigma^2}} \quad (1)$$

where $\sigma$=10 mm, ($x_n$, $y_n$) are the center coordinates of the Gaussians, l is the center-to-center distance for a square array, amplitude A is 10 mm and $A_n$ either 10 mm or −10 mm. To form a 3D substrate, the surface was thickened to 1.73 mm.

A non-planar substrate 92, as well as other planar substrates and masks, were fabricated with an Objet Connex 500 3D printer and photopolymer (VEROWHITE+) cured by exposure to ultraviolet light.

Before designing a conformal antenna array for non-planar substrate 92, a planar array 94 of four patch antenna elements 96 was designed for a planar substrate 93 with a footprint of 100 cm and thickness of 1.73 mm.

The dimension of each element 96 was 21.5 mm and included inset notches for tuning each patch to resonate near 4 GHz, verified by numerical simulations. The four patches 96 fit within an 87.25 mm×87.25 mm area, and the center-to-center distance between neighboring patches was 66 mm, allowing for the width of two elements between patches. Parameters for the planar array's main feed line 98 and secondary feed lines 100 were calculated using stripline impedance formulas, also verified with simulations. The thickness of initial feed line 98 was tuned to an impedance of 71Ω, which fed two 100Ω secondary feed lines 100 before splitting into individual antenna elements with 50Ω inputs 102. Return loss of this planar implementation was below −10 dB at 4 GHz, where the radiation pattern was directed along an axis normal to the plane of the antenna with a maximum realized gain of 9 dB, shown as 104 in FIG. 9(b).

Figure 9:
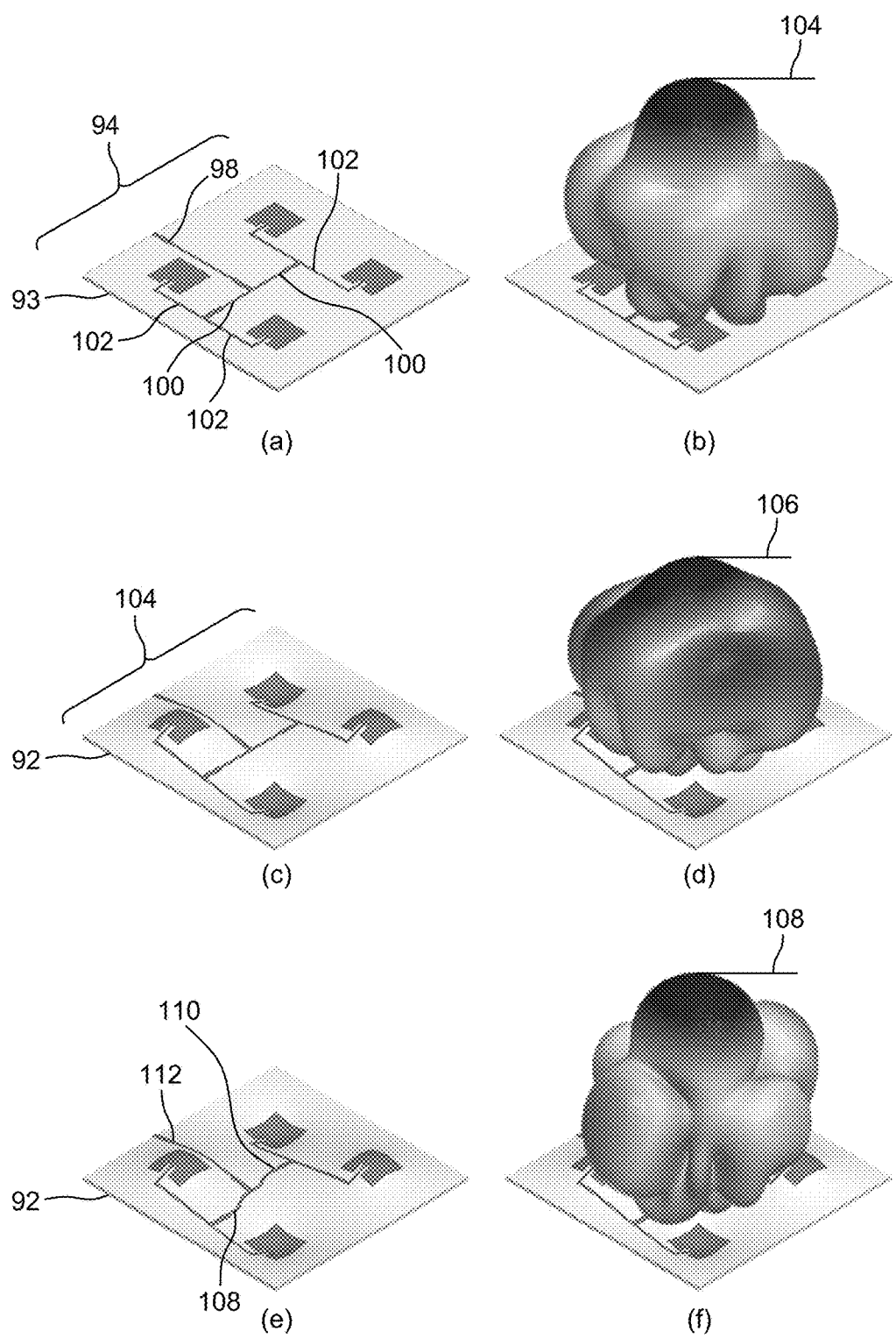
FIGS. 9(a)-(f) show the results of varying the dimensions of a 3D mask according to the teachings of the present invention so that the performance of a conformed electromagnetic device made using that 3D mask more closely matches the performance of a similar electromagnetic device on a plane surface.

With planar array design 94 complete, a model of a conformal antenna array 104 was generated by projecting planar array model 94 onto non-planar substrate surface 92 such that each antenna element was centered on one of the maxima or minima of the non-planar substrate. Though a simulation of the unaltered projection onto the curved surface predicted only a slightly altered return loss near 4 GHz, the new geometry resulted in a significant degradation in antenna gain 106 and alteration of the antenna pattern as shown in FIG. 9(d).

To counter the performance decrease that accompanied the transformation to non-planarity, several design changes were introduced. First, a parameter sweep was performed that revealed patch dimensions elongated during projection onto the non-planar substrate, resulting in a shift in patch resonance frequency. The change for convex patches was minimal, but the shift for concave antenna patches was significant enough so that the patch dimensions were shortened slightly to 21 mm×21 mm, which recentered their resonance at 4 GHz. While this change drastically improved return loss, it did not improve realized gain, which was caused by the height difference between the convex and concave antenna patches. At a difference of 20 mm, the phase of radiated waves was shifted such that it significantly broadened the array's radiation pattern. To compensate, secondary feed lines 108 and 110 were made asymmetric to account for the extra distance and enable maximum gain while in the conformal array configuration. It was also found that main feed line 112 should be put on the convex side as shown instead of the concave side to minimize undesired coupling between the nearby patch and the feedline. Together, these changes increased the overall antenna array gain to 9.5 dB as shown at 108.

The teachings of the present invention will provide precise, economical and rapid selective metallization onto substrates, primarily for forming electromagnetic device structures, but can be easily extended to a wide range of other uses.

For example, the teachings of the present invention have been used for putting electromagnetics circuit components, such as capacitors, resistors, amplifiers and phase shifters, conformably onto substrates. The teachings of the present invention allow selective deposition of materials (metal and other materials) on arbitrary surfaces for propagation (transmission lines and circuit components), for scattering and for radiation on arbitrary surfaces.

Various other modifications to the invention as described may be made, as might occur to one with skill in the art of the invention, within the scope of the claims. Therefore, not all contemplated example embodiments have been shown in complete detail. Other embodiments may be developed without departing from the spirit of the invention or from the scope of the claims.

We claim:

1. A 3D stencil for guiding deposition of a shaped structure onto a surface, comprising:
    (a) a facing side for facing the surface, including:
        (i) a facing side opening representing part of the shape; and
    (b) an opposing side facing away from the facing side, including:
        (i) an opposing side opening representing part of the shape;
        (ii) an opposing side island representing part of the shape, the opposing side island including walls extending from the opposing side to the facing side forming a bottom island representing part of the shape; and,
        (iii) a bridge connecting the opposing side island to an opposing side opening-defining surface that defines at least a portion of the opposing side opening,
        wherein a thickness of the bridge terminates prior to the facing side to form one or more undercuts below the opposing side so that a deposited shaped structure onto the surface can be fully connected.

2. A 3D stencil mask for guiding deposition of a shaped electromagnetic element onto a non-planar surface, comprising:
    (a) a non-planar facing side, including:
        (i) a facing side opening representing part of the shape of the electromagnetic element; and
    (b) an opposing side, including:

(i) an opposing side opening representing part of the shape of the electromagnetic element;

(ii) an opposing side island representing part of the shape of the electromagnetic element, the opposing side island including walls extending from the opposing side to the facing side, forming a facing side island representing part of the shape of the electromagnetic element; and, (iii) a bridge connecting the opposing side island to an opposing side opening-defining surface that defines at least a portion of the opposing side opening, wherein the non-planar facing side is configured to conformally cover a non-planar surface having a shape that is congruent with a shape of the non-planar facing side, the non-planar facing side being configured to maintain the shape when no force is applied to both the non-planar facing side and the opposing side.

3. A 3D stencil mask for guiding deposition of a pattern of shaped electromagnetic elements onto a non-planar surface, comprising:

(a) a non-planar facing side for facing the non-planar surface, including:

(i) a plurality of facing side openings, each facing side opening representing part of the shape of the electromagnetic elements; and (b) an opposing side, including:

(i) a plurality of opposing side openings, each opposing side opening representing part of the shape of the electromagnetic elements;

(ii) a plurality of opposing side islands, each opposing side island representing part of the shape of the electromagnetic elements, each opposing side island including walls extending from the opposing side to the facing side forming a facing side island representing part of the shape of the electromagnetic elements; and, (iii) a plurality of bridges, each bridge connecting a corresponding opposing side island to an opposing side opening-defining surface that defines a portion of at least one of the opposing side openings of the plurality of opposing side openings over which the bridge extends, wherein the non-planar facing side is configured to conformally cover a non-planar surface having a shape that is congruent with a shape of the non-planar facing side, the non-planar facing side being configured to maintain the shape when no force is applied to both the non-planar facing side and the opposing side.

4. The 3D stencil mask of claim 2, wherein the 3D stencil mask is further configured such that the dimensions of the shaped electromagnetic element are altered from the dimensions of a corresponding shape of an electromagnetic element on a planar surface to result in electromagnetic properties of the shaped electromagnetic element matching properties of the electromagnetic element on a planar surface.

5. The 3D stencil of claim 1, wherein the bottom island further comprises a facing side opening-defining surface that defines at least a portion of the facing side opening, and wherein the bottom island is void of a direct connection to the facing side opening-defining surface.

6. The 3D stencil of claim 1, wherein the bridge is rigidly coupled to the opposing side island and the opposing side opening-defining surface.

7. The 3D stencil mask of claim 2, wherein a thickness of the bridge terminates prior to the facing side to form one or more undercuts below the opposing side so that a deposited shaped structure onto the surface can be fully connected.

8. The 3D stencil mask of claim 7, wherein the facing side island further comprises a facing side opening-defining surface that defines at least a portion of the facing side opening, and wherein the facing side island is void of a direct connection to the facing side opening-defining surface.

9. The 3D stencil mask of claim 7, wherein the bridge is rigidly coupled to the opposing side island and the opposing side opening-defining surface.

10. The 3D stencil mask of claim 3, wherein a thickness of one or more of the bridges terminates prior to the facing side to form one or more undercuts below the opposing side so that a deposited pattern of shaped electromagnetic elements onto the non-planar surface can be fully connected.

11. The 3D stencil mask of claim 10, wherein the facing side island further comprises a facing side opening-defining surface that defines at least a portion of at least one of the facing side-openings of the plurality of facing side openings, and wherein the facing side island is void of a direct connection to the facing side opening-defining surface.

12. The 3D stencil mask of claim 10, wherein the bridge is rigidly coupled to the opposing side island and the opposing side opening-defining surface.

13. The 3D stencil of claim 1, wherein the facing side is non-planar and is configured to conformally cover a non-planar surface having a shape that is congruent with a shape of the facing side, the facing side being configured to maintain the shape when no force is applied to both the non-planar facing side and the opposing side.

14. A method of depositing a shaped structure onto a surface, comprising:

placing a facing side of a 3D stencil having a non-planar facing side onto a non-planar surface having a shape that is congruent with a shape of the non-planar facing side such that the non-planar facing side conformally covers the non-planar surface onto which a material for forming a shaped structure is to be deposited; and depositing a material onto the non-planar surface over which the 3D stencil is placed such that the material becomes the shaped structure, the shaped structure having at least a layer facing the non-planar surface that conforms to the non-planar surface, wherein the non-planar facing side of the 3D stencil maintains the shape that is congruent with the non-planar surface when no force is applied to both the non-planar facing side and an opposed opposing side of the 3D stencil, wherein the 3D stencil further comprises:

a facing side opening representing part of the shaped structure;

the opposing side facing away from the facing side, the opposing side including:

an opposing side opening representing part of the shaped structure;

an opposing side island representing part of the shaped structure, the opposing side island including walls extending from the opposing side to the facing side forming a bottom island representing part of the shaped structure; and a bridge connecting the opposing side island to an opposing side opening-defining surface that defines at least a portion of the opposing side opening.

15. The method of claim 14, wherein the shaped structure is a shaped electromagnetic element.

16. A kit, comprising:
- the 3D stencil mask of claim 2; and
- an electromagnetic material for depositing onto the non-planar surface.

17. The 3D stencil mask of claim 2, wherein the non-planar facing side is configured to be substantially in contact with the non-planar surface.

\* \* \* \* \*